(12) United States Patent
Maffeis

(10) Patent No.: US 11,152,956 B1
(45) Date of Patent: Oct. 19, 2021

(54) COSET PROBABILITY BASED DECODING FOR NON-BINARY LDPC CODES

(71) Applicant: GYLICON LTD, London (GB)

(72) Inventor: Margherita Maffeis, Dalmine (IT)

(*) Notice: Subject to any disclaimer, the term of this patent is extended or adjusted under 35 U.S.C. 154(b) by 0 days.

(21) Appl. No.: 17/031,060

(22) Filed: Sep. 24, 2020

(51) Int. Cl.
*H03M 13/00* (2006.01)
*H03M 13/11* (2006.01)
*H03M 13/37* (2006.01)
*H03M 13/27* (2006.01)

(52) U.S. Cl.
CPC .... *H03M 13/1148* (2013.01); *H03M 13/1111* (2013.01); *H03M 13/2735* (2013.01); *H03M 13/3746* (2013.01)

(58) Field of Classification Search
CPC .......... H03M 13/1148; H03M 13/1111; H03M 13/2735; H03M 13/3746; H03M 13/3784
See application file for complete search history.

(56) References Cited

U.S. PATENT DOCUMENTS

| | | | |
|---|---|---|---|
| 7,831,895 B2 | 11/2010 | Lin | |
| 8,291,284 B2 | 10/2012 | Savin | |
| 8,407,550 B2* | 3/2013 | Yedidia | H04B 10/6165 714/752 |
| 8,739,009 B1 | 5/2014 | Varnica | |
| 8,954,820 B2* | 2/2015 | Anaraki | H03M 13/114 714/758 |
| 9,356,734 B2* | 5/2016 | Myung | H04L 1/0071 |
| 9,432,055 B2 | 8/2016 | Zhang | |
| 9,444,493 B2 | 9/2016 | Zhang | |
| 10,298,261 B2 | 5/2019 | Nemati Anaraki | |
| 10,395,754 B2 | 8/2019 | Maffeis | |

(Continued)

OTHER PUBLICATIONS

Fan Zhang et al., List Message Passing Achieves Capacity on the q-ary Symmetric Channel for Large q, IEEE, pp. 283-287. (Year: 2007).*

(Continued)

*Primary Examiner* — Esaw T Abraham
(74) *Attorney, Agent, or Firm* — John M. Janeway; Janeway Patent Law PLLC

(57) ABSTRACT

A method for iteratively decoding read bits in a solid state storage device, wherein the read bits are encoded with a Q-ary LDPC code defined over a binary-extension Galois field GF($2^r$) and having length N. The method comprises: determining a binary Tanner graph of the Q-ary LDPC code based on a binary coset representation of the Galois field GF($2^r$) the binary Tanner graph comprising ($2^r$−1) binary variable nodes, ($2^r$−1−r) binary parity-check nodes each one connected to one or more binary variable nodes according to the binary coset representation and ($2^r$−1) binary check nodes each one connected to a respective binary variable node mapping the read bits into N symbols providing each symbol of the N symbols to a respective Q-ary variable node; providing each bit of the symbol to a respective binary variable node of the respective Q-ary variable node and iteratively decoding each symbol.

21 Claims, 8 Drawing Sheets

(56) References Cited

U.S. PATENT DOCUMENTS

Figure 1A:
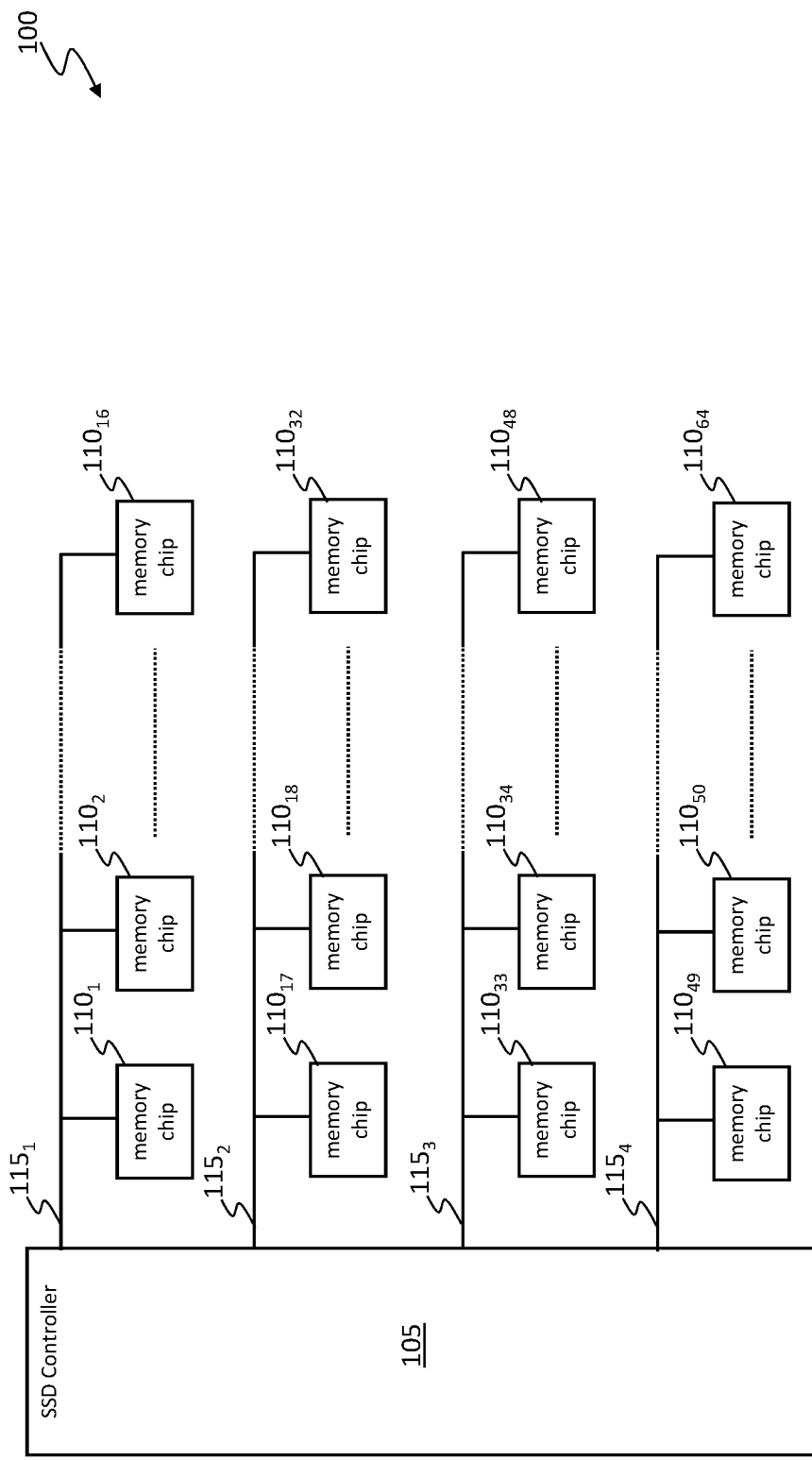

| | | | |
|---|---|---|---|
| 10,404,280 B2 | 9/2019 | Lin | |
| 10,476,523 B2* | 11/2019 | Marchand | H03M 13/1131 |
| 10,560,120 B2* | 2/2020 | Marchand | H03M 13/1131 |
| 2007/0201632 A1 | 8/2007 | Ionescu | |
| 2009/0319858 A1 | 12/2009 | Sharon | |
| 2010/0077278 A1* | 3/2010 | Wang | H04L 9/3231 |
| | | | 714/752 |
| 2011/0051831 A1* | 3/2011 | Subrahmanya | H04L 1/0051 |
| | | | 375/262 |
| 2011/0200149 A1* | 8/2011 | Choi | H03M 13/114 |
| | | | 375/341 |
| 2012/0266040 A1 | 10/2012 | Hamkins | |
| 2013/0212447 A1 | 8/2013 | Li | |
| 2013/0212451 A1 | 8/2013 | Nemati Anaraki | |
| 2013/0275827 A1 | 10/2013 | Wang | |
| 2013/0305114 A1 | 11/2013 | Olcay | |
| 2014/0068381 A1 | 3/2014 | Zhang | |
| 2015/0303942 A1* | 10/2015 | Zhang | H03M 13/1117 |
| | | | 714/763 |
| 2015/0381204 A1 | 12/2015 | Zhang | |
| 2015/0381205 A1 | 12/2015 | Zhang | |
| 2016/0233894 A1 | 8/2016 | Nemati Anaraki | |
| 2016/0378594 A1 | 12/2016 | Motwani | |
| 2017/0149444 A1 | 5/2017 | Lin | |
| 2018/0351577 A1 | 12/2018 | Qin | |
| 2019/0097656 A1 | 3/2019 | Bhatia | |
| 2019/0341936 A1 | 11/2019 | Lin | |

OTHER PUBLICATIONS

Alla Ghaith et al., Fast and Reduced-Complexity Decoding Rule for qary LDPC Codes by Using the Duality Properties, IEEE pp. 221-228. (Year: 2006).*

Giuliano et al., On the Global and Local Decoding of q-Ary SC-LDPC Codes With Moderate Coupling Length, IEEE, pp. 3258-3262 (Year: 2013).*

Li, Y., & Ryan, W. E. (2005). Bit-reliability mapping in LDPC-coded modulation systems. IEEE Communications Letters, 9(1), 1-3.

H. Joo, D. Shin and S. Hong, "Adaptive Bit-Reliability Mapping for LDPCCoded High-Order Modulation Systems," 2007 IEEE 65th Vehicular Technology Conference—VTC2007-Spring, Dublin, 2007, pp. 1539-1543. (Year: 2007).

Huang, Q., & Yuan, S. (2015). Bit reliability-based decoders for non-binary LDPC codes. IEEE Transactions on Communications, 64(1), 38-48.

Ghaith et al., Fast and Reduced-Complexity Decoding Rule for q-ary LDPC Codes by Using the Duality Properties, 2006, IEEE, pp. 221-228. (Year: 2006).*

Shen et al., Q-ary LDPC Decoders with Reduced Complexity, Jan. 27-30, 2013, IEEE, pp. 941-946. (Year: 2013).

Song et al., Reduced-Complexity Decoding of Q-ary LDPC Codes for Magnetic Recording, Mar. 2003, IEEE, vol. 39, No. 2, pp. 1087-1087. (Year: 2003).

Wijekoon et al., Coset Probability Based Majority-logic Decoding for Non-binary LDPC Codes, 2019, IEEE, pp. 1-5. (Year: 2019).

Xiong et al, Improved Iterative Soft-Reliability-Based Majority-Logic Decoding Algorithm for Non-Binary Low-Density Parity-Check Codes, 2011, IEE, pp. 894-898. (Year: 2011).

Zhao et al., Joint detection-decoding of majority-logic decodable non-binary low-density parity-check coded modulation systems: an iterative noise reduction algorithm, Feb. 26, 2014, IET Commun., vol. 8, Issue 10, pp. 1810-1819. (Year: 2014).

"Li et al., Simulation research of nonbinary LDPC code based on Finite Fields, 2009, IEEE, pp. 519-522. (Year: 2009)".

Rathi et al., Density evolution, thresholds and the stability condition for non-binary LDPC codes, Dec. 2005, IEEE, vol. 152, No. 6, pp. 1069-1074. (Year: 2005).

* cited by examiner

COSET PROBABILITY BASED DECODING FOR NON-BINARY LDPC CODES

BACKGROUND OF THE INVENTION

Field of the Invention

The present invention generally relates to solid state storage devices, also known as "Solid State Drives" (hereinafter, SSD devices), such as SSD devices provided with non-volatile memory chips (e.g., NAND flash memory chips) for storing data. More particularly, the present invention relates to SSD devices provided with error correction capabilities. Even more particularly, the present invention relates to a SSD device implementing (e.g., in a controller thereof) a method for decoding bits encoded with a non-binary LDPC code.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and a SSD device controller (hereinafter, SSD controller) for managing SSD device operations, such as write/program, erase and read operations.

A common type of memory cell comprises a floating gate transistor: each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same symbols or bit patterns), practically each threshold voltage associated with a corresponding logical state (or, equivalently, with a corresponding symbol or bit pattern) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a 2-bit MLC memory cell (hereinafter referred to as MLC memory cell for the sake of conciseness) and in the top drawing of FIG. 2C for a TCL memory cell. In such figures the threshold voltage distributions are denoted by $D_j$ (j ranging from 1 to 2 for the SLC memory cell, from 1 to 4 for the MLC memory cell, and from 1 to 8 for the TLC memory cell).

Figure 2A:
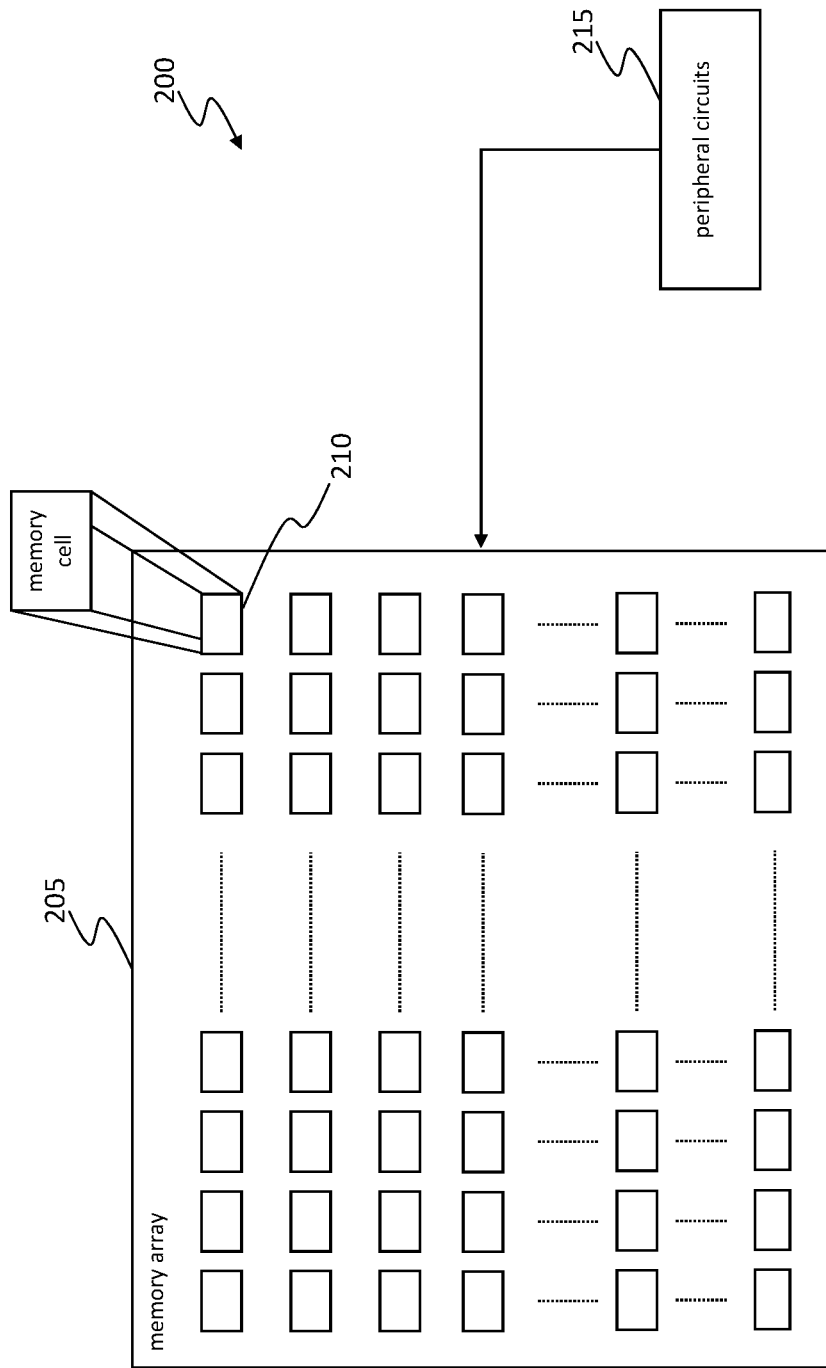
Figure 2B:
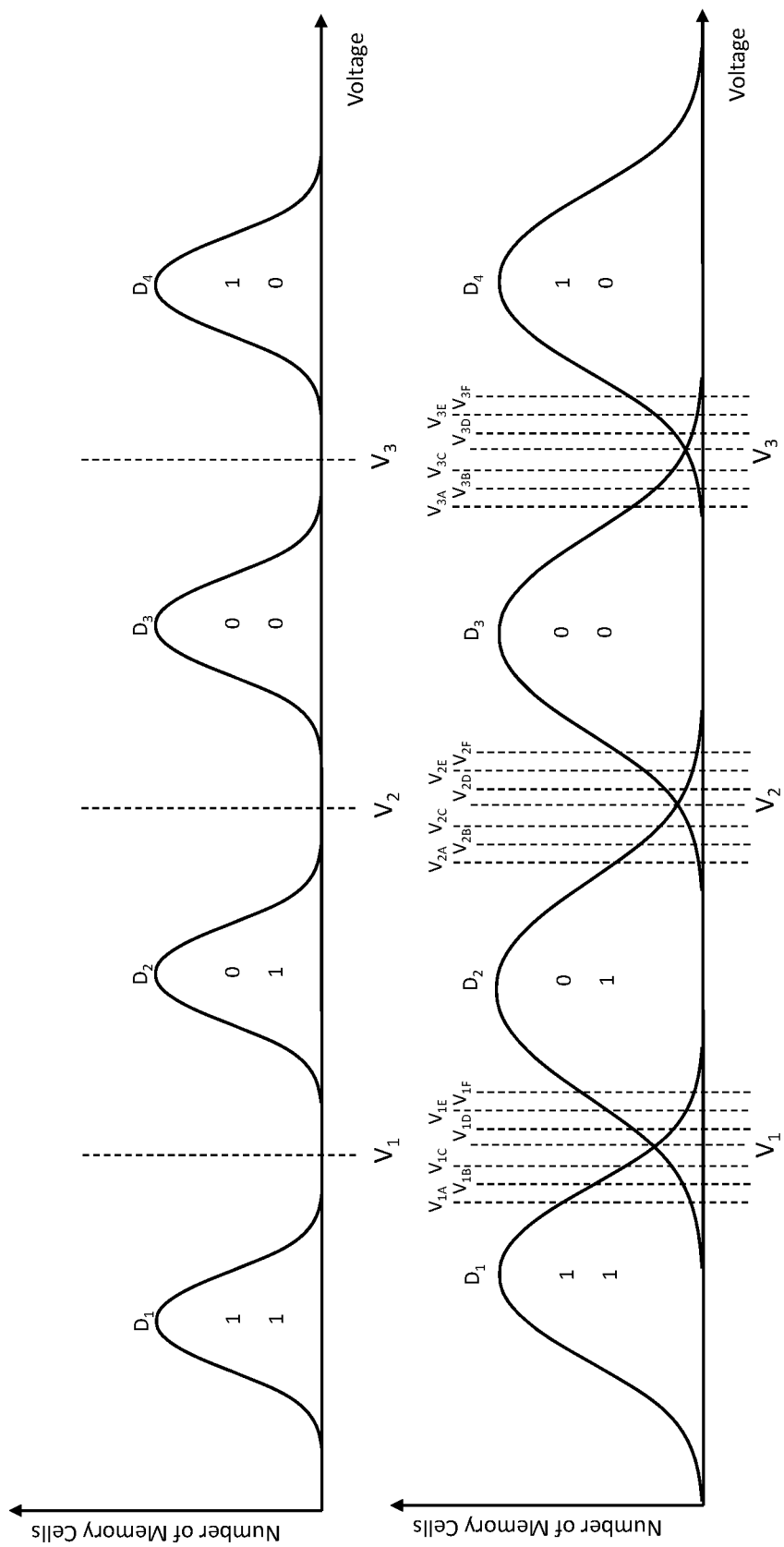
Figure 2C:
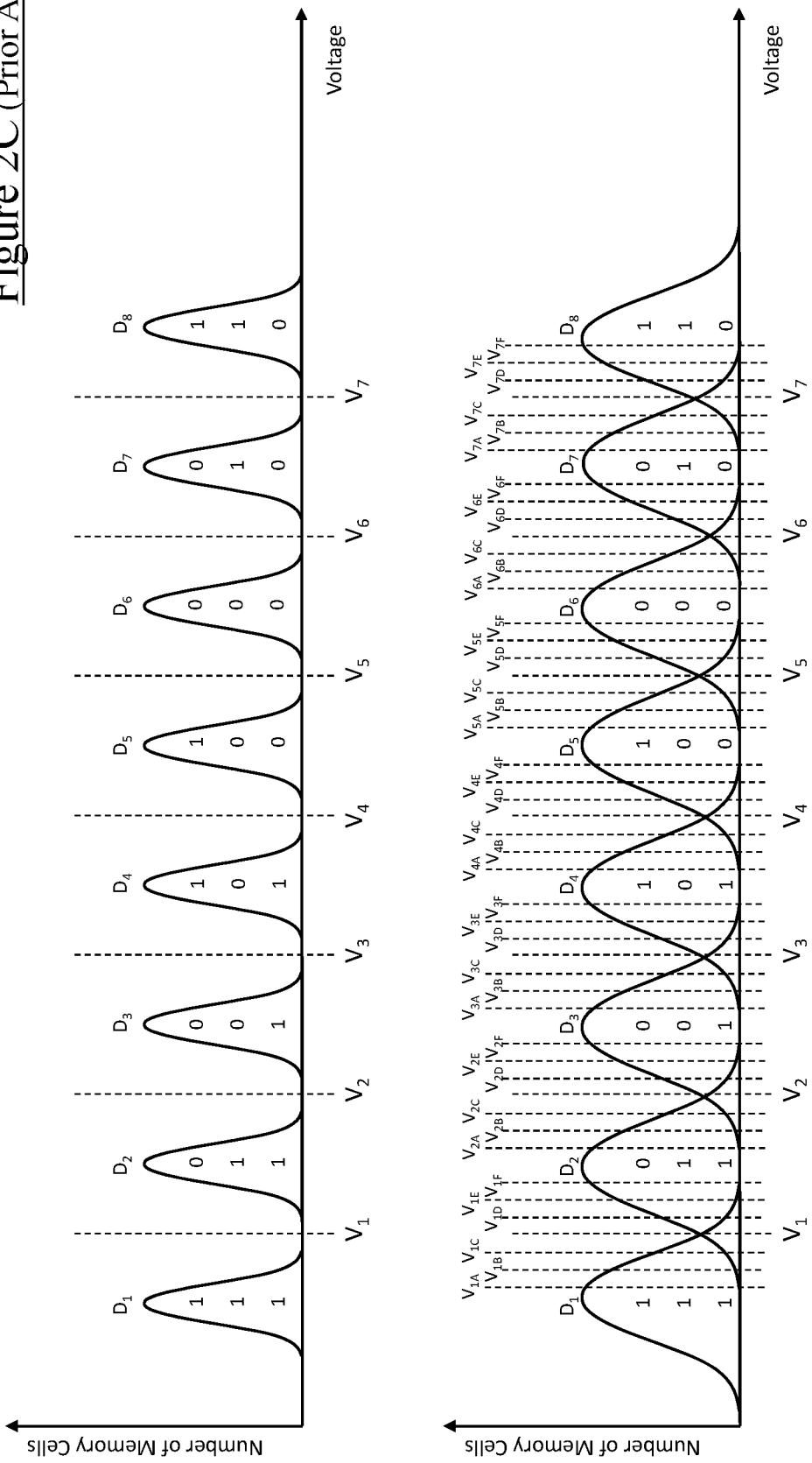

The threshold voltage distributions $D_j$ are (ideally) spaced apart from one another, and a corresponding reference voltage $V_k$ (usually referred to as hard reference voltage) is set between each pair of adjacent threshold voltage distributions $D_j$ for sensing/reading the logical state of the memory cells (k=1, 2, 3 in the example of FIG. 2B and k=1, 2, 3, 4, 5, 6, 7 in the example of FIG. 2C).

In case of the SLC memory cell, during a read operation a threshold voltage below the hard reference voltage $V_1$ represents the symbol "1", and a threshold voltage above the hard reference voltage $V_1$ represents the symbol "0".

In case of the MLC memory cell, during a read operation a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10".

In case of the TLC memory cell and in the exemplary considered coding distributions, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110".

To read a memory cell, the threshold voltage of the memory cell is compared to the hard reference voltages $V_k$. Typically, reading a memory cell that stores a symbol of m bits may require, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention, which translates into partially overlapping areas of adjacent threshold voltage distributions $D_j$ (shown in the bottom drawings of FIGS. 2B and 2C) and, hence, into the increasing of the number of bit errors.

In order to compensate for larger bit errors, and to increase SSD device reliability, "Forward Error Correction"

has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors without rereading. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). The RBER is typically estimated (e.g., by the SSD controller) according to a shape of the threshold voltage distributions $D_j$, and particularly according to the overlapping areas of the adjacent threshold voltage distributions $D_j$.

As a result of the advances in memory cell technology, the RBER for selected memory cells is increasing. The RBER observed after application of the ECC code is referred to as "Frame Bit Error Rate" (FER), whereas the FER divided by the number of read bits is referred to as "Uncorrectable Bit Error Rate" (UBER).

The acceptable UBER is often dependent upon the application in which the SSD device is intended to be employed. In the case of price sensitive, consumer applications, which experience a relatively low number of accesses (e.g., program/erase cycles), the SSD device may tolerate a higher UBER as compared to a high-end application experiencing a relatively high number of accesses, such as an enterprise application.

To achieve an acceptable UBER, especially for enterprise applications, ECC codes such as "Low-Density Parity-Check" (LDPC) codes have been widely used (both alone and in combination with other ECC codes), which allow determining each bit value by means of hard bits (i.e., the read bits resulting from comparisons to the hard reference voltages $V_k$) and of additional information including soft bits and an indication of the reliability of each read (hard and soft) bit typically evaluated according to RBER—the decoding based on the hard and soft bits being referred to as hard and soft decoding, respectively.

As far as LDPC codes are concerned, binary LDPC codes and non-binary LDPC codes are known.

Non-binary LDPC codes are known to outperform binary codes of comparative length over many types of channels. However, the high decoding complexity of non-binary LDPC codes has so far restricted their practical usage.

SUMMARY OF THE INVENTION

The Applicant has recognized that non-binary LDPC codes do not lend themselves to be applied in SSD devices.

According to the Applicant, this is substantially due to the fact that non-binary LDPC codes feature high complexity of Q-ary sum-product algorithm (and variants thereof), and to the fact that the known decoding algorithms for decoding the non-binary LDPC codes are affected by big performance losses and high error-floor when used with low column weight codes.

The Applicant has tackled the above-discussed issues, and has devised a SSD device implementing an improved decoding of non-binary LDPC codes.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a method for iteratively decoding read bits in a solid state storage device, wherein the read bits are encoded with a Q-ary LDPC code defined over a binary-extension Galois field $GF(2^r)$ and having length N. The method comprises:

determining a binary Tanner graph of the Q-ary LDPC code based on a Q-ary Tanner graph of the Q-ary LDPC code, and based on a binary coset representation of the Galois field $GF(2^r)$ according to which the Galois field $GF(2^r)$ includes a plurality of cosets of additive subgroups of size $2^{(r-1)}$ and each element of the Galois field $GF(2^r)$ is represented as a binary value indicative of the belonging or non-belonging of that element to each one of said plurality of cosets, the binary Tanner graph comprising for each Q-ary variable node/Q-ary check node pair of the Q-ary Tanner graph:
($2^r-1$) binary variable nodes each one being associated with a respective one of said cosets;
($2^r-1-r$) binary parity-check nodes each one being connected to one or more of said ($2^r-1$) binary variable nodes according to said binary coset representation of the Galois field $GF(2^r)$, wherein each binary parity-check node corresponds to a respective parity-check equation associated with a first parity-check matrix that results from said binary coset representation, and
($2^r-1$) binary check nodes each one being connected to a respective one of said ($2^r-1$) binary variable nodes according to a second parity-check matrix defining the Q-ary LDPC code,
mapping the read bits into N symbols each one including, for each bit thereof, a bit value and a reliability thereof,
providing each symbol of said N symbols to a respective Q-ary variable node, and providing each bit of said each symbol to a respective one of the ($2^r-1$) binary variable nodes of said respective Q-ary variable node, and
iteratively decoding each symbol based on bit reliabilities of each bit of that symbol determined at each respective binary variable node and at each binary check node connected to that binary variable node, and based on the parity-check equation associated with the first parity-check matrix and corresponding to the parity-check node connected to that binary variable node.

According to an embodiment of the present invention, said iteratively decoding each symbol comprises iteratively performing the following steps:
(i) at each binary check node, determining a first bit reliability of each bit of the respective symbol according to a second bit reliability of that bit that is determined at each binary variable node connected to that binary check node, and,
ii) at each binary variable node, updating the second bit reliability of each bit of the respective symbol based on the first bit reliability of that bit determined at each binary check node connected to that binary variable node, and based on the parity-check equation associated with the first parity-check matrix and corresponding to the parity-check node connected to that binary variable node.

According to an embodiment of the present invention, said iteratively performing the steps (i) and (ii) is based on Belief Propagation algorithm, or an approximation thereof.

According to an embodiment of the present invention, said iteratively decoding each symbol further comprises, after step ii) of each current iteration, performing a decoding attempt based on the second bit reliability determined at the current iteration, and determining an outcome of the decoding attempt. Said iteratively performing the steps i) and ii) for a subsequent iteration following the current iteration is preferably performed in case of a negative outcome of the decoding attempt at the current iteration.

According to an embodiment of the present invention, said determining an outcome of the decoding attempt is based on syndrome calculation on the decoding attempts associated with the binary variable nodes.

According to an embodiment of the present invention, said iteratively performing the steps i) and ii) for a subsequent iteration following the current iteration is performed until a maximum number of decoding iterations is reached.

According to an embodiment of the present invention, the method further comprises, at a first running of the method, initializing the second bit reliability of each bit at each binary variable node. Said initializing preferably comprises:
  initializing the second bit reliability of each bit at r of the $(2^r-1)$ binary variable nodes according to the respective bit value and the reliability thereof, a sign of the reliability of the bit value for example providing said bit value,
  initializing the second bit reliability of each bit at the remaining $(2^r-1-r)$ binary variable nodes according to the parity-check equations associated with the first parity-check matrix and corresponding to the parity-check nodes connected to those binary variable nodes.

Another aspect of the present invention relates to a controller for a solid state storage device, wherein the controller is configured to read bits from memory cells of the solid state storage device, the read bits being encoded with a Q-ary LDPC code defined over a binary-extension Galois field $GF(2^r)$ and having length N. The controller is configured to perform at least part of the above method.

According to an embodiment of the present invention, the controller is configured for:
  mapping the read bits into N symbols each one including, for each bit thereof, a bit value and a reliability thereof;
  decoding the N symbols based on a binary Tanner graph of the Q-ary LDPC code, wherein the binary Tanner graph is determined based on a Q-ary Tanner graph of the Q-ary LDPC code, and based on a binary coset representation of the Galois field $GF(2^r)$ according to which the Galois field $GF(2^r)$ includes a plurality of cosets of additive subgroups of size $2^{(r-1)}$ and each element of the Galois field $GF(2^r)$ is represented as a binary value indicative of the belonging or non-belonging of that element to each one of said plurality of cosets, and wherein the binary Tanner graph comprises for each Q-ary variable node/Q-ary check node pair of the Q-ary Tanner graph:
    $(2^r-1)$ binary variable nodes each one being associated with a respective one of said cosets;
    $(2^r-1-r)$ binary parity-check nodes each one being connected to one or more of said $(2^r-1)$ binary variable nodes according to said binary coset representation of the Galois field $GF(2^r)$, wherein each binary parity-check node corresponds to a respective parity-check equation associated with a first parity-check matrix that results from said binary coset representation, and
    $(2^r-1)$ binary check nodes each one being connected to a respective one of said $(2^r-1)$ binary variable nodes according to a second parity-check matrix defining the Q-ary LDPC code,
  wherein the controller is configured for performing said decoding of the N symbols by providing each symbol of said N symbols to a respective Q-ary variable node, wherein each bit of said each symbol is provided to a respective one of the $(2^r-1)$ binary variable nodes of said respective Q-ary variable node, and by iteratively decoding each symbol based on bit reliabilities of each bit of that symbol determined at each respective binary variable node and at each binary check node connected to that binary variable node, and based on the parity-check equation associated with the first parity-check matrix and corresponding to the parity-check node connected to that binary variable node.

According to an embodiment of the present invention, the controller is configured to perform said iteratively decoding by iteratively performing the following steps:
  i) at each binary check node, determining a first bit reliability of each bit of the respective symbol according to a second bit reliability of that bit that is determined at each binary variable node connected to that binary check node, and,
  ii) at each binary variable node, updating the second bit reliability of each bit of the respective symbol based on the first bit reliability of that bit determined at each binary check node connected to that binary variable node, and based on the parity-check equation associated with the first parity-check matrix and corresponding to the parity-check node connected to that binary variable node.

According to an embodiment of the present invention, said iteratively performing the steps (i) and (ii) is based on Belief Propagation algorithm, or an approximation thereof.

According to an embodiment of the present invention, the controller is further configured to, after step ii) of each current iteration, perform a decoding attempt based on the second bit reliability determined at the current iteration, and to determine an outcome of the decoding attempt. The controller is advantageously configured to iteratively perform the steps i) and ii) for a subsequent iteration following the current iteration in case of a negative outcome of the decoding attempt at the current iteration.

According to an embodiment of the present invention, said outcome of the decoding attempt is based on syndrome calculation on the decoding attempts associated with the binary variable nodes.

According to an embodiment of the present invention, the controller is configured to iteratively perform the steps i) and ii) for a subsequent iteration following the current iteration until a maximum number of decoding iterations is reached.

According to an embodiment of the present invention, the controller is further configured to initialize the second bit reliability of each bit at each binary variable node. Said initializing preferably comprises:
  initializing the second bit reliability of each bit at r of the $(2^r-1)$ binary variable nodes according to the respective bit value and the reliability thereof, a sign of the reliability of the bit value for example providing said bit value,
  initializing the second bit reliability of each bit at the remaining $(2^r-1-r)$ binary variable nodes according to the parity-check equations associated with the first parity-check matrix and corresponding to the parity-check nodes connected to those binary variable nodes.

A further aspect of the present invention relates to a solid state storage device (such as a flash memory device) including memory cells (such as flash memory cells) and the controller of above.

BRIEF DESCRIPTION OF THE ANNEXED DRAWINGS

Figure 1B:
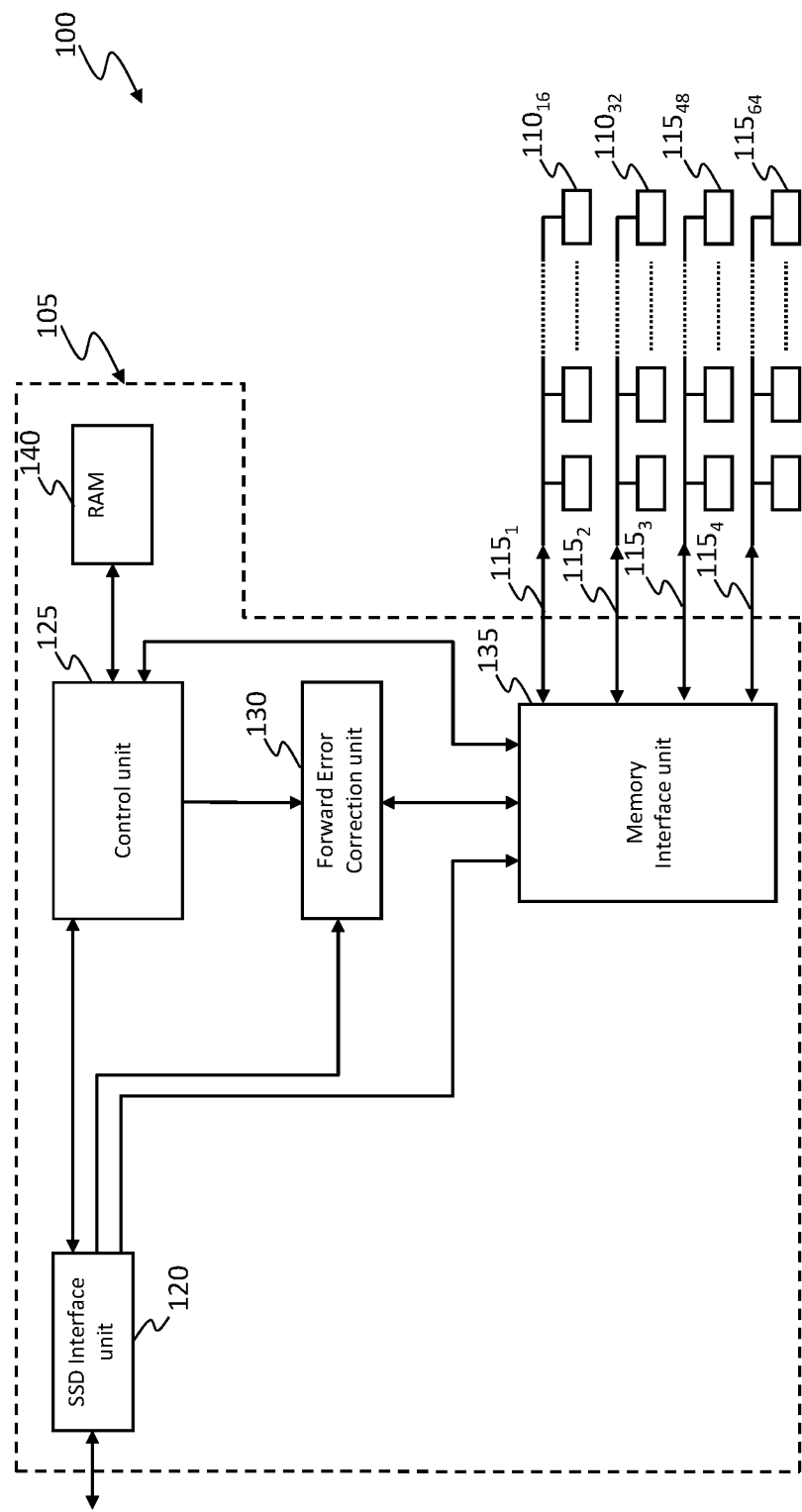
Figure 3A:
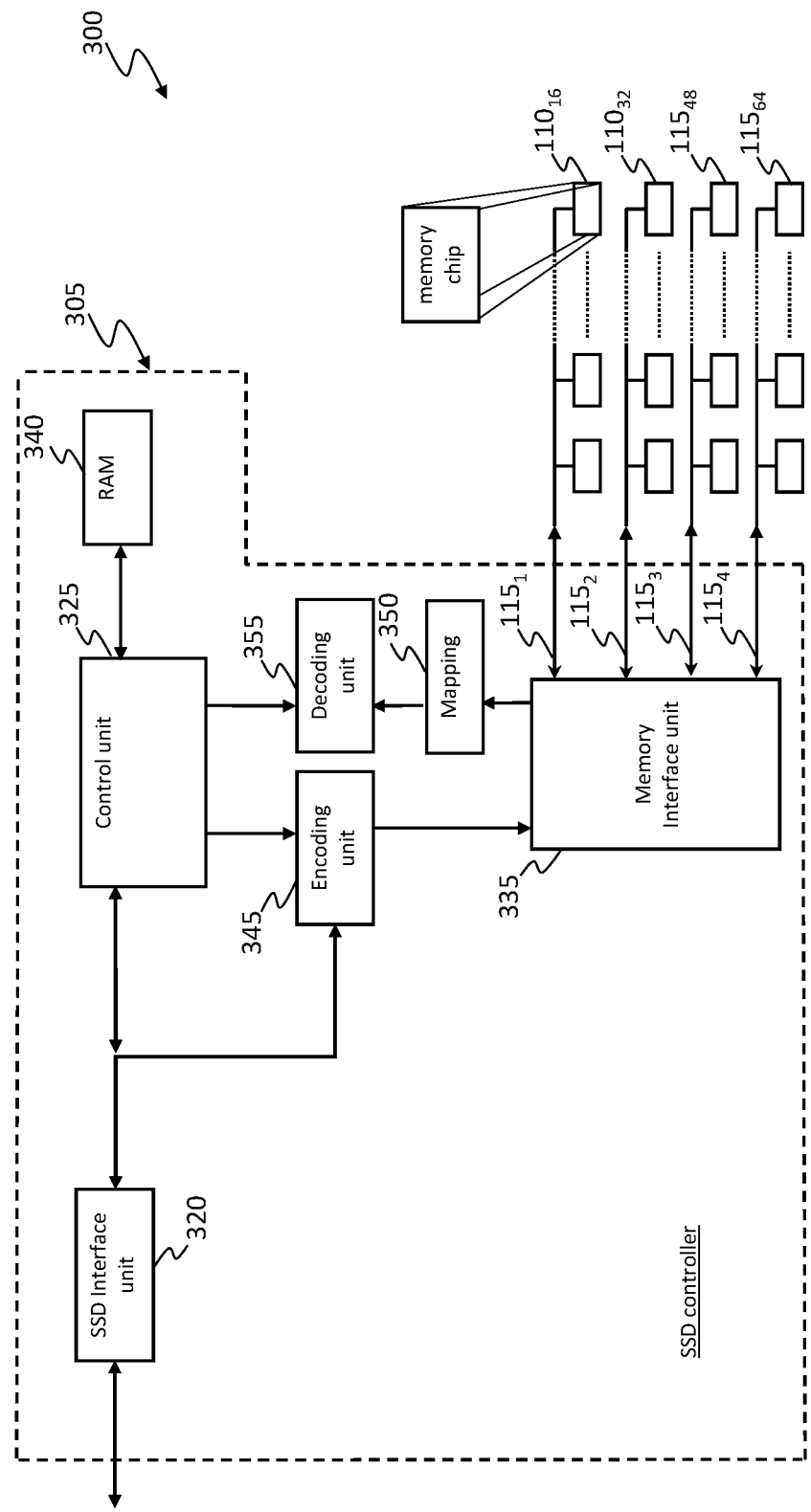
Figure 3B:
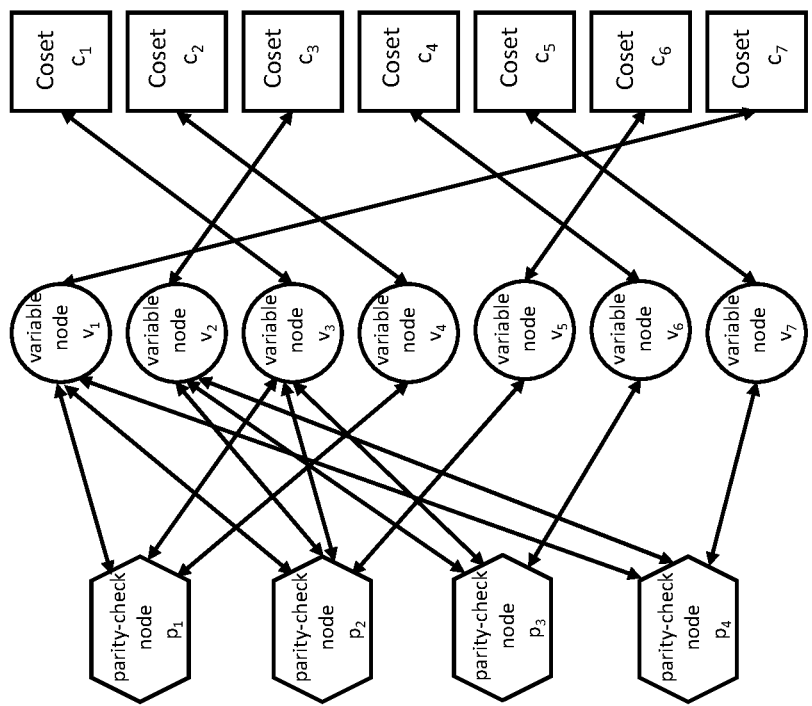
Figure 4:
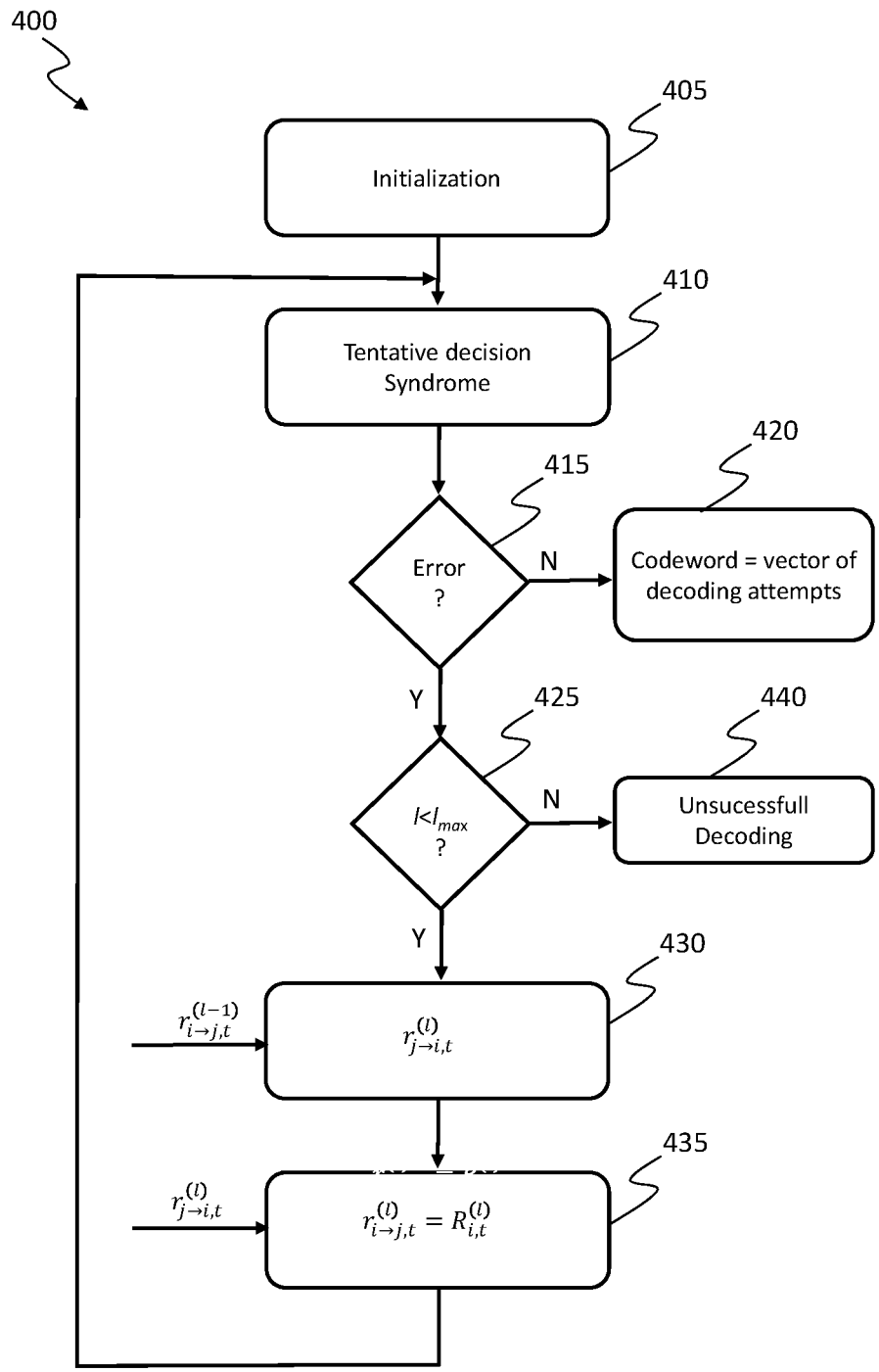

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to the present invention;

FIG. 3B schematically shows an exemplary binary Tanner graph according to the principles of the present invention, and FIG. 4 schematically shown an activity diagram of a decoding procedure carried out by the SSD controller of FIG. 3A according to an embodiment of the present invention.

DETAILED DESCRIPTION OF PREFERRED EMBODIMENTS OF THE INVENTION

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_i$ for storing bits even in the absence of external power supply (i=1, 2, 3, . . . , I, with I=64 in the example at issue), and a plurality of (e.g., synchronous and/or asynchronous) channels $115_j$ (j=1, 2, 3, . . . , J, with J=4 in the example at issue) communicably coupling the SSD controller 105 and the memory chips $110_i$ to each other—in the exemplary illustration, each channel $115_j$ communicably couples the SSD controller 105 to a set of 16 memory chips $110_i$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

With reference also to FIG. 1B, it schematically shows, in terms of operating units, a simplified architecture of a typical SSD controller 105—the term "unit" being herein intended to emphasize functional (rather than implementation) aspects thereof (each unit including, for example, hardware or circuitry with processing and/or storing capabilities). For the sake of completeness, such a figure also shows, with a smaller size, the memory chips $110_i$ and the channels $115_j$ (only some of the memory chips being numbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to and from the memory chips $110_i$ along the channels $115_j$ and bit transport to and from the SSD interface unit 120, and coordinating enabling and/or disabling of the memory chips $110_i$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bit transport between the SSD controller 105 and the memory chips $110_i$ along the respective channels $115_j$, the SSD controller 105 comprises one (as herein exemplary illustrated) or more memory interface units 135—alternatively, a memory interface unit 135 for each channel 115 may be provided, or a memory interface unit 135 for each memory chip $110_i$, or for each group of memory chips $110_i$ may be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_i$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125, e.g. for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_i$ may comprise one or more flash memory dice.

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

Each memory cell 210 is programmable to store a bit or group of bits (or bit pattern) among a plurality of bit patterns, wherein each bit pattern identifies or is associated with a respective logical state of the memory cell 210. Each memory cell 210 preferably comprises a floating gate transistor (not illustrated). Each bit pattern identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one bit pattern comprising one bit (i.e. two logical states, 0 or 1, defining, i.e. being associated with, two threshold voltages), in "Multi-Level Cell" (MLC) technology each memory cell (or MLC memory cell) is capable of storing one bit pattern comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one bit pattern comprising three bits (i.e. eight logical states, 000, 001, 010, 011, 100, 101, 110 or 111, defining, i.e. being associated with, eight threshold voltages).

While, ideally, all memory cells 210 in the flash memory die 200 should feature and be associated with same (nominal) threshold voltages for same logical states (or, equivalently, for same bit patterns), practically each threshold voltage associated with a corresponding logical state (or, equivalently, associated with a corresponding bit pattern) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take; otherwise stated, memory cells programmed to store a same bit pattern among the plurality of bit patterns exhibit actual threshold voltages that are variable over the memory cells 210 around the corresponding nominal threshold voltage thereby defining a respective threshold voltage distribution $D_j$ associated with that same bit pattern. This is schematically shown in the top drawing of FIG. 2B for a MLC memory cell and in the top drawing of FIG. 2C for a TCL memory cell.

The threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1, 2, 3 in the example of FIG. 2B and k=1, 2, 3, 4, 5, 6, 7 in the example of FIG. 2C). Therefore, each pair of adjacent bit patterns, which are associated with a corresponding adjacent pair of nominal threshold voltages (and hence with a corresponding adjacent pair of threshold voltage distributions $D_j$), can be discriminated, during a read operation, by a respective hard reference voltage $V_k$ which is between the corresponding adjacent nominal threshold voltages.

In the case of SLC memory cell (k=1), during a read operation a threshold voltage below the hard reference voltage $V_1$ represents the symbol "1", and a threshold voltage above the hard reference voltage $V_1$ represents the symbol "0".

In the case of MLC memory cell, during a read operation, a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10".

In the case of TLC memory cell and in the exemplary considered coding distributions, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110".

To read a memory cell 210, the threshold voltage of the memory cell 210 is compared to the hard reference voltages $V_k$. According to an embodiment, reading a memory cell 210 that stores a bit pattern of m bits requires, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention translate into partially overlapping areas of adjacent threshold voltage distributions $D_j$ (shown in the bottom drawings of FIGS. 2B and 2C) and, hence, into increasing of the probability of the number of bit errors per unit time (i.e., the RBER).

With reference now to FIG. 3A, it schematically shows, in terms of operating units, a simplified architecture of a SSD controller 305 according an embodiment the present invention. For the sake of completeness, such a figure also shows, in a smaller size, the memory chips $110_i$ and the channels $115_j$ (equivalent to those illustrated in the previous figures), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units may also intended to represent corresponding method steps of a method according to the present invention.

As visible in the figure, the SSD controller 305 comprises, similarly to the SSD controller 105, a SSD interface 320, a control unit 325, a memory interface unit 335, and a memory unit 340, which will not be discussed again for the sake of conciseness.

The SSD controller 305 also comprises an encoding unit 345 for encoding the bits to be stored in the memory array 205 (i.e., the information bits) by means of an ECC code. According to an embodiment of the present invention, the encoding unit 345, and the respective decoding unit (discussed in the following), are implemented in the FEC unit 130.

Preferably, the ECC code is an ECC code allowing soft decoding—or, otherwise stated, an ECC code that allows determining each bit value by means of hard bits (i.e., the read bits resulting from comparisons to the hard reference voltages $V_k$) and of additional information including soft bits and an indication of the reliability of each read (hard and soft) bit typically evaluated or estimated according to RBER. More preferably, the ECC code is a "Low-Density Parity-Check" (LDPC) code—hence, the encoding unit 345 will be referred to as LDPC encoding unit 345 and the corresponding encoded bits will be referred to as LDPC encoded bits. LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate (the ratio between the information bits to the (LDPC, in the case at issue) encoding unit and the total number of bits created by the encoding unit, the total number of bits created by the encoding unit including the parity bits), LDPC code approaches the Shannon limit more than ECC codes typically used in prior art solutions (such as Bose-Chaudhuri-Hocquenghem (BCH) codes), which translates into area saving while maximizing the probability of accurately recovering the bits after a read operation.

According to the preferred embodiment herein considered, the LDPC code used to encode the bits to be stored in the memory array 205 is a non-binary LDPC code (i.e. a Q-ary LDPC code (Q≠2)) defined over a binary-extension Galois field $GF(2^r)$—from now on, whenever LDPC code is mentioned, it should be taken to mean the non-binary (i.e., Q-ary) LDPC code defined over a binary-extension Galois field $GF(2^r)$. A finite field or Galois field (GF) is a field that contains a finite number of elements: as with any field, a Galois field is a set on which the operations of multiplication, addition, subtraction and division are defined and satisfy certain basic rules.

Back to FIG. 3A, the SSD controller 305 is configured to store the LDPC encoded bits in the memory chips $110_i$ (e.g., similarly to the above, by means of the memory interface unit 335 that transmits the LDPC encoded bits to the memory chips $110_i$, and thanks to control unit 325 action that controls addressing of the memory chips $110_i$ to be written/programmed). In the exemplary illustrated embodiment the LDPC encoded bits are fed directly to the memory interface unit 335, however this should not be construed limitatively: indeed, depending on the specific implementation, the LDPC encoded bits may be subject to additional processing before their storing in the memory chips $110_i$ (for example, each codeword of the LDPC code may be advantageously converted into a binary vector of length N*r, N being the length of the LDPC code).

Preferably, the SSD controller 305 also comprises a mapping unit 350 for "mapping" the read bits into N symbols, and a decoding unit 355 for decoding, based on a Q-ary Tanner graph of the Q-ary LDPC code, the N symbols in order to extract the information bits therefrom.

Each bit of each symbol of the N symbols preferably comprises a bit value and a reliability thereof.

For the purposes of the present disclosure, each symbol to be decoded is determined based on a number of (typically, multiple) readings of each bit of that symbol. These multiple readings of each bit may comprise one or more hard readings (i.e. the read operations at the hard reference voltages $V_k$) and/or one or more soft readings (i.e. the read operations at the soft reference voltages $V_{kA}$-$V_{kF}$, with the soft reference voltages $V_{kA}$-$V_{kC}$ that may for example be obtained by progressively decreasing the hard reference voltage $V_k$ by a 0.5V step, and with the soft reference voltages $V_{kD}$-$V_{kF}$ that may for example be obtained by progressively increasing the hard reference voltage $V_k$ by a 0.5V step), and these multiple readings of each bit of each symbol are used to determine the value and the reliability of each bit of that symbol.

Preferably, each symbol is in the form of a vector of integer values each one associated with a respective bit of that symbol, with sign and magnitude (i.e., absolute value) of each integer value that may for example be indicative of, respectively, the value of the respective bit ("0" or "1") and the reliability of that bit (i.e., the probability that the read bit is correct).

By way of example only, for each bit of each symbol, an integer value higher than 0 may indicate that the associated bit is more likely a 0 than a 1, while an integer value lower than 0 may indicate that the associated bit is more likely a 1 than a 0. Further, for each bit of each symbol, a greater magnitude of the integer value may indicate a higher probability or reliability of the associated bit. Thus, a bit represented by an integer value equal to 15 is more likely to be a 0 than a bit represented by an integer value equal to 5, and a bit represented by an integer value equal to −15 is more likely to be a 1 than a bit represented by an integer value equal to −5.

According to the present invention, each bit value and the associated reliability (i.e., the integer values being used during the mapping operation to represent each symbol) are determined based on Belief Propagation algorithm, or an approximation thereof (such as Min-Sum, Offset Min-Sum, Normalized Min-Sum or Layered Min-Sum algorithms).

As mentioned above, the decoding unit 355 is configured to decode the N symbols based on a Q-ary Tanner graph in order to extract the information bits therefrom. A Tanner graph is an effective graphical representation for LDPC codes (R. M. Tanner, "*A recursive approach to low complexity codes*", IEEE Trans. Inform. Theory, 27(5):533-547, 1981, which is incorporated herein by reference); particularly, for each parity-check matrix defining the LDPC code exists a corresponding bipartite Tanner graph having variable nodes and check nodes, wherein the number of check nodes equals the number of parity-check bits in the codeword (in turn corresponding to the number of rows of the parity-check matrix) and the number of variable nodes equals to the number of bits in the codeword (in turn corresponding to the number of columns of the parity-check matrix), and wherein each check node is connected to a variable node (through the so-called "edge") when the corresponding element of the parity-check matrix is non-zero. In the following, each check node connected to one or more variable nodes through respective "edges" will be referred to also as neighboring check node for those one or more variable nodes (or equivalently, as check node in neighborhood relationship with those one or more variable nodes), and vice versa.

More particularly, according to the principles of the present invention, the decoding procedure carried out by the SSD controller 305 (and specifically by the decoding unit 355) is based on a novel expansion of the Q-ary Tanner graph.

Broadly speaking, this graph expansion is based on the idea of an element in the Galois field $GF(2^r)$ belonging to cosets of additive subgroups of size $2^{r-1}$ of the same Galois field $GF(2^r)$, and to the "conversion" of the traditionally used symbol probabilities into probabilities of belonging to cosets. This enables the expansion of a Q-ary Tanner graph into a larger binary Tanner graph.

As better discussed here below, the binary Tanner graph of the (non-binary, i.e. Q-ary) LDPC code is derived from the conventional Q-ary Tanner graph, and is based on a coset representation of the Galois field $GF(2^r)$, particularly on a binary coset representation of the Galois field $GF(2^r)$.

Binary Coset Representation of the Galois Field $GF(2^r)$

By coset is herein meant a subset of a mathematical group that consists of all the products obtained by multiplying either on the right or the left a fixed element of the group by each of the elements of a given subgroup.

According to the binary coset representation of the Galois field $GF(2^r)$, the Galois field $GF(2^r)$ includes a plurality S of cosets $C_s$ (s=1, 2, . . . , S) of additive subgroups of size $2^{(r-1)}$—it can be proven that $S=2^r-1$ in the Galois field $GF(2^r)$—and each element of the Galois field $GF(2^r)$ is represented as a binary value indicative of the belonging or non-belonging of that element to each s-th coset $C_s$.

The proposed Q-ary Tanner graph expansion into the binary Tanner graph is based on the following and provable two coset properties:

(i) when each of the elements belonging to the s-th coset $C_s$ is multiplied with another element in the Galois field $GF(2^r)$ (exception made for the additive identity), the result is another coset of the same Galois field $GF(2^r)$ (or the same s-th coset $C_s$ if multiplicative identity is chosen);

(ii) given two elements α and β belonging to the Galois field $GF(2^r)$ (α, β∈$GF(2^r)$), and given the probabilities $p_s(α)$, $p_s(β)$ of the elements α and β of belonging to a same s-th coset $C_s$, the probability $p_s(k)$ that an element k resulting from the sum of the two elements α and β (i.e., α+β=k) belongs to the same s-th coset $C_s$ may be determined as:

$$p_s(k)=(1-p_s(\alpha))p_s(\beta)+(1-p_s(\beta))p_s(\alpha)$$

Coset properties (i) and (ii) may advantageously be used to expand the Q-ary Tanner graph into the binary Tanner graph, in that they affect permutation and convolution operations at check nodes in decoding non-binary LDPC codes.

Particularly, if at the check nodes are available the probabilities of each element of belonging to each different coset $C_s$ (hereinafter also referred to as coset probabilities) instead of the symbol probabilities, coset property (i) means that the coset probabilities can be permuted similarly to how symbol probabilities are permuted, whereas coset property (ii) means that the convolution operation can be replaced by the much simpler operation given by the corresponding equation for the probability $p_s(k)$ (which, interestingly, is the same operation used at check nodes in decoding binary LDPC codes).

Considering, just as an example, r=3 (Galois field $GF(2^3)$), with primitive polynomial $p(x)=x^3+x+1$ and primitive element α, the respective cosets $C_s$ are the following:

$$
\begin{array}{c|l}
C_1 & \{\alpha^0, \alpha^3, \alpha^6, \alpha^5\} \\
C_2 & \{\alpha^1, \alpha^3, \alpha^4, \alpha^5\} \\
C_3 & \{\alpha^2, \alpha^6, \alpha^4, \alpha^5\} \\
C_4 & \{\alpha^0, \alpha^3, \alpha^2, \alpha^4\} \\
C_5 & \{\alpha^0, \alpha^1, \alpha^2, \alpha^5\} \\
C_6 & \{\alpha^1, \alpha^3, \alpha^2, \alpha^6\} \\
C_7 & \{\alpha^0, \alpha^1, \alpha^6, \alpha^4\}
\end{array}
$$

Considering for example the element $\beta \in GF(2^r)$, and introducing a binary random variable $\alpha_{\beta,s}$ whose value is indicative of the belonging or non-belonging of each element $\beta$ to each s-th coset $C_s$, such as for example:

$\alpha_{\beta,s}=1$, if $\beta \in C_s$ $\alpha_{\beta,s}=0$, if $\beta \notin C_s$ the binary coset representation of each element $\beta$ of the Galois field $GF(2^3)$ is the following:

| $\beta$ | $\alpha_{\beta,1}$ | $\alpha_{\beta,2}$ | $\alpha_{\beta,3}$ | $\alpha_{\beta,4}$ | $\alpha_{\beta,5}$ | $\alpha_{\beta,6}$ | $\alpha_{\beta,7}$ |
|---|---|---|---|---|---|---|---|
| $\alpha^{-1}$ | 0 | 0 | 0 | 0 | 0 | 0 | 0 |
| $\alpha^0$ | 1 | 0 | 0 | 1 | 1 | 0 | 1 |
| $\alpha^1$ | 0 | 1 | 0 | 0 | 1 | 1 | 1 |
| $\alpha^2$ | 0 | 0 | 1 | 1 | 1 | 1 | 0 |
| $\alpha^3$ | 1 | 1 | 0 | 1 | 0 | 1 | 0 |
| $\alpha^4$ | 0 | 1 | 1 | 1 | 0 | 0 | 1 |
| $\alpha^5$ | 1 | 1 | 1 | 0 | 1 | 0 | 0 |
| $\alpha^6$ | 1 | 0 | 1 | 0 | 0 | 1 | 1 |

As should be understood from this binary coset representation, the set of vectors form the codewords of a (7, 3) local code. Generalizing for a Galois field $GF(2^r)$, the binary coset representation of the elements of the Galois field $GF(2^r)$ results in a codewords of a $(2^r-1, r)$ local code, in which the r bits of the binary coset representation of the Galois field $GF(2^r)$ (which are also the bits transmitted through a binary input channel when using a Q-ary code) form the information bits of that code, and $(2^r-1-r)$ bits form local parity bits (i.e., parity bits generated by the application of the local code) each one associated with a corresponding parity-check equation.

Q-Ary Tanner Graph Expansion into Binary Tanner Graph

Based on the above binary coset representation, and on the above coset properties (i) and (ii), the Q-ary Tanner graph of a non-binary LDPC code may advantageously be expanded into the binary Tanner graph.

An exemplary binary Tanner graph (resulting from such an expansion of the Q-ary Tanner graph) according to an embodiment of the present invention is schematically depicted in FIG. 3B. As should be understood, the depicted binary Tanner graph relates to the expansion of the generic, single Q-ary variable node/Q-ary check node pair among the plurality of Q-ary variable node/Q-ary check node pairs resulting from the Q-ary Tanner graph for decoding N symbols: by Q-ary variable node/Q-ary check node pair it is herein meant the pair of variable and check nodes that, in the (original) Q-ary Tanner graph, are connected to each other through a respective "edge", and will be also referred to as Q-ary node pair for the sake of conciseness.

As visible in such a figure, the binary Tanner graph advantageously comprises, for each Q-ary node pair of the plurality of Q-ary node pairs resulting from the Q-ary Tanner graph:

($2^r-1$) binary variable nodes $v_t$ (t=1, 2, . . . , T, with T=$2^r-1$) each one associated with a respective s-th coset $C_s$. In the example at issue of Galois field $GF(2^3)$, T=7, therefore each Q-ary variable node of each Q-ary node pair of the Q-ary Tanner graph is expanded into seven binary variable nodes $v_1, v_2, v_3, v_4, v_5, v_6, v_7$;

($2^r-1-r$) binary parity-check nodes $p_c$ (c=1, 2, . . . , C, with C=$2^r-1-r$)) each one connected to one or more of the binary variable nodes $v_t$ according to the binary coset representation of the Galois field $GF(2^r)$. In the example at issue of Galois field $GF(2^3)$, C=4, each Q-ary variable node of the Q-ary Tanner graph is thus expanded into four binary parity-check nodes $p_1, p_2, p_3, p_4$. Each binary parity-check node $p_c$ corresponds to a respective parity-check equation associated with a parity-check matrix that results from the binary coset representation. Each binary parity-check node $p_c$ connected to one or more binary variable nodes $v_t$ through respective "edges" will be referred to also as neighboring binary parity-check node $p_c$ for those one or more binary variable nodes $v_t$ (or equivalently, as binary parity-check node $p_c$ in neighborhood relationship with those one or more binary variable nodes $v_t$), and, vice versa, each binary variable node $v_t$ connected to a respective binary parity-check node $p_c$ through a respective "edge" will be referred to also as neighboring binary variable node $v_t$ for that binary parity-check node $p_c$ (or equivalently, as binary variable node $v_t$ in neighborhood relationship with binary parity-check node $p_c$). Each binary parity-check node $p_c$ is only concerned with the coset probabilities of neighboring binary variable nodes $v_t$, as apparent from coset property (ii); and ($2^r-1$) binary check nodes $c_v$ (v=1, 2, . . . , V, with V=$2^r-1$) each one connected to a respective one of the binary variable nodes $v_t$ (through the "edges") according to the parity-check matrix that defines the non-binary LDPC code—otherwise stated, the edges are drawn between the binary variable nodes $v_t$ and the binary check nodes $c_v$ according to the edges and their weights in the original Q-ary Tanner graph, as a result of coset property (i). Similarly to the above, each binary check node $c_v$ connected to a respective binary variable node $v_t$ through a respective "edge" will be referred to also as neighboring binary check node $c_v$ for that binary variable node $v_t$ (or, equivalently, as binary check node $c_v$ in neighborhood relationship with that binary variable node $v_t$), and, vice versa, each binary variable node $v_t$ connected to a respective binary check nodes $c_v$ through a respective "edge" will be referred to also as neighboring binary variable node $v_t$ for that binary check node $c_v$ (or, equivalently, as binary variable node $v_t$ in neighborhood relationship with that binary check node $c_v$). As should be readily understood, considering the overall expanded binary Tanner graph, each binary check node $c_v$ of a Q-ary check node is connected to a single binary variable node $v_t$ of each Q-ary variable node connected to that Q-ary check node, therefore each binary check node $c_v$ may be connected to (i.e., it may be in a neighborhood relationship with) two or more t-th binary variable nodes $v_t$ (wherein each t-th binary variable node $v_t$ advantageously receives the t-th bit of a respective symbol, as better discussed below).

FIG. 4 schematically shows an activity diagram of a decoding procedure 400 carried out by the SSD controller 305 of FIG. 3A according to an embodiment of the present invention. For the sake of description ease and conciseness, the decoding procedure will be discussed by making reference to the generic Q-ary node pair (wherein, as discussed above, the Q-ary variable node of the Q-ary node pair is expanded into the above-discussed binary variable nodes $v_t$ and binary parity-check nodes $p_c$, and the Q-ary check node of the Q-ary node pair is expanded into the above-discussed binary check nodes $c_v$), it being understood that the decoding procedure 400 is performed as such at any other Q-ary node pair of the plurality of Q-ary node pairs resulting from the Q-ary Tanner graph.

According to the principles of the present invention, upon providing each symbol to a respective Q-ary variable node, and upon providing each bit of each symbol to a respective one of the ($2^r-1$) binary variable nodes $v_t$ of the respective Q-ary variable node (whereby the t-th binary variable node $v_t$ of each Q-ary variable node also denotes the t-th bit of the symbol received at that Q-ary variable node), the decoding procedure 400 is configured to iteratively decode each symbol based on bit reliabilities of each bit of that symbol determined at each respective t-th binary variable node $v_t$ and at each v-th binary check node $c_v$ connected to that t-th binary variable node $v_t$, and preferably based on the parity-check equation associated with the parity-check matrix resulting from the binary coset representation and corresponding to the c-th parity-check node $p_c$ connected to that t-th binary variable node $v_t$.

According to the exemplary embodiment herein considered and illustrated, the decoding procedure 400 is configured to iteratively perform, at each Q-ary node pair, the steps 430 and 435 discussed here below.

Step 430

At each binary check node $c_v$ of each Q-ary check node, a bit reliability (hereinafter referred to as CN ("Check Node") bit reliability) of each t-th bit of the respective symbol(s) (i.e., of the symbol(s) received at the variable node(s) connected to the check node to which that binary check node $c_v$ belongs) is determined according to a bit reliability of that bit that is available (or determined) at each t-th binary variable node $v_t$ connected to that binary check node $c_v$ (hereinafter referred to as VN ("Variable Node") bit reliability). As will be better understood from the following discussion, the VN bit reliability available (or determined) at each binary variable node $v_t$ may take initialization values (e.g., when the decoding procedure is at the first iteration) and/or updated values being refined over previous iterations (e.g., when the decoding procedure is at a l-th iteration following the first iteration—i.e., $l>1$).

The CN bit reliability available (or determined) at each binary check node $c_v$ may advantageously be based on Belief Propagation algorithm, or an approximation thereof (such as Min-Sum, Offset Min-Sum, Normalized Min-Sum or Layered Min-Sum algorithms).

Just as an example, the CN bit reliability at each v-th binary check node $c_v$ at the l-th iteration may advantageously be determined based on the Belief Propagation algorithm as follows:

$$r^{(l)}_{j \to i,t} = \prod_{i' \in M_j, i' \neq i} \text{sign}(r^{(l-1)}_{i' \to j,t}) \cdot \Phi\left( \sum_{i' \in M_j, i' \neq i} \phi(|r^{(l-1)}_{i' \to j,t}|) \right)$$

$$\phi(x) = -\log\left( \tanh\left( \frac{x}{2} \right) \right)$$

Just as an another example, the CN bit reliability at each v-th binary check node $c_v$ at the l-th iteration may advantageously be determined based on the Min-Sum algorithm as follows:

$$r^{(l)}_{j \to i,t} = \prod_{i' \in M_j, i' \neq i} \text{sign}(r^{(l-1)}_{i' \to j,t}) \cdot \min_{i' \in M_j, i' \neq i} |r^{(l-1)}_{i' \to j,t}|$$

wherein, in the above equations:

$M_j$ represents the set of Q-ary variable nodes in neighborhood relationship with the j-th Q-ary check node to which the v-th binary check node $c_v$ belongs;

$r^{(l)}_{j \to i,t}$ represents me message nom the j-th Q-ary check node to the i-th neighboring Q-ary variable node about the CN bit reliability of the t-th bit determined by the v-th binary check node $c_v$ of that j-th Q-ary check node in the l-th decoding iteration, and $r^{(l)}_{i \to j,t}$ represents me message from the i-th Q-ary variable node to the j-th neighboring Q-ary check node (to which the v-th binary check node $c_v$ belongs) about the VN bit reliability of the t-th bit in the (l−1)-th decoding iteration.

In other words, at each j-th Q-ary check node, the CN bit reliability of the t-th bit (to be sent to the i-th Q-ary variable node in neighborhood relationship with that j-th Q-ary check node) is determined by that j-th Q-ary check node, at the l-th decoding iteration, based on the VN bit reliabilities of the t-th bit determined at the (l−1)-th decoding iteration by the set $M_j$ of Q-ary variable nodes in neighborhood relationship with that j-th Q-ary check node other than the i-th neighboring Q-ary variable node (i'≠i).

Step 435

At each binary variable node $v_t$ of that Q-ary node pair, the VN bit reliability of each bit of the respective symbol is determined based on the CN bit reliability of that bit determined at each binary check node $c_v$ connected to that binary variable node $v_t$.

The VN bit reliability of each t-th bit of the respective symbol is preferably determined, at each t-th binary variable node $v_t$, based on Belief Propagation algorithm, or an approximation thereof (such as Min-Sum, Offset Min-Sum, Normalized Min-Sum or Layered Min-Sum algorithms).

Just as an example, the VN bit reliability at each t-th binary variable node $v_t$ at the l-th iteration may be determined based on the Belief Propagation algorithm as follows:

$$R^{(l)}_{i,t} = R^{(l-1)}_{i,t} + \sum_{j \in N_i} r^{(l)}_{j \to i,t}$$

wherein:

$N_i$ represents the set of Q-ary check nodes in neighborhood relationship with the i-th Q-ary variable node to which the t-th binary variable node $v_t$ belongs;

$$r_{j \to i,t}^{(l)}$$

represents the message from the j-th Q-ary check node in the neighborhood relationship with the i-th Q-ary variable node about the CN bit reliability of the t-th bit determined at the j-th Q-ary check node (particularly, at the binary check node $c_v$ thereof connected to the t-th binary variable node $v_t$) in the l-th decoding iteration, and $R_{i,t}^{(l)}$ and $R_{i,t}^{(l-1)}$ represent the VN bit reliability of the t-th bit determined at the t-th binary variable node $v_t$ of the i-th Q-ary variable node during the l-th decoding iteration and the (l−1)-th decoding iteration, respectively.

In other words, at each i-th Q-ary variable node, the VN bit reliability of the t-th bit is determined by that i-th Q-ary variable node, at the l-th decoding iteration, based on (e.g., the sum of) the VN bit reliability of the t-th bit determined at the (l−1)-th decoding iteration (by the same i-th Q-ary variable node) and the CN bit reliabilities of the t-th bit determined, during the l-th decoding iteration, by each j-th Q-ary check node in the neighborhood relationship with the i-th Q-ary variable node.

Advantageously, as herein exemplary assumed, the VN bit reliability at each i-th Q-ary variable node at the l-th iteration is further updated based on the local parity-check equation associated with the parity-check node $p_c$ connected to (i.e., in the neighborhood relationship with) that t-th binary variable node $v_t$ (the updating of the VN bit reliability based on the parity-check equation resulting in mathematical relationships analogous to those discussed above in connection with step 430, thus any further explanation will be omitted for the sake of conciseness).

Thereafter, the VN bit reliability ($R_{i,t}^{(l)}$) of each t-th bit at the l-th decoding iteration is sent back through the respective message (i.e., $$r_{i \to j,t}^{(l)}$$

from the i-th Q-ary variable node, to each j-th neighboring Q-ary check node for starting a new iteration (l=l+1):

$$\forall j \in N_i$$

$$r_{i \to j,t}^{(l)} = R_{i,t}^{(l)}$$

As mentioned above, the decoding procedure 400 is configured to perform the steps 430 and 435 discussed above iteratively. Preferably, steps 430 and 435 are iterated only after an unsuccessful tentative decoding (as conceptually represented in the activity diagram by steps 410 and 415, and by connection between steps 435 and 410) and, even more preferably, only if the l-th decoding iteration is below a maximum number $l_{max}$ of decoding iterations that are admitted to be performed in order to meet predefined requirements (such as a latency of the SSD device)—step 425.

Particularly, at step 410, each Q-ary variable node is advantageously configured to take a decision (decoding attempt) on its first r bits (or the information bits in the binary coset representation), preferably according to the sign of the VN bit reliability, even more preferably as follows:

$$E_{i,t}^{(l)} = 0, R_{i,t}^{(l)} \geq 0$$

$$E_{i,t}^{(l)} = 1, R_{i,t}^{(l)} < 0$$

wherein $E_{i,t}^{(l)}$ denotes the decoding attempt of the t-th bit determined at the t-th binary variable node $v_t$ of the i-th Q-ary variable node during the l-th decoding iteration.

Then, the resulting vector of tentative decisions (or decoding attempts) associated with all the Q-ary variable nodes is advantageously used to determine an outcome of the decoding attempt.

According to the preferred embodiment herein considered, the vector of decoding attempts of all the Q-ary variable nodes is used to calculate the syndrome, whereby a successful decoding (positive outcome of the decoding attempts) is advantageously determined if the calculated syndrome gives rise to an all-zero vector (exit branch N of step 415), in which case the vector of decoding attempts forms the output codeword, otherwise a new iteration is started conditioned to the fact that the l-th decoding iteration is below the maximum number $l_{max}$ of decoding iterations (step 425).

If, exit branch N of step 425, the l-th decoding iteration is not below the maximum number $l_{max}$ of decoding iterations, an unsuccessful decoding is determined (step 440) and the decoding procedure 400 ends; otherwise, exit branch Y of step 425, steps 430, 435, 410, 415 and 425 are repeated as such during the following decoding iteration (i.e., the (l+1)-th decoding iteration).

Therefore, according to the advantageous embodiment of the present invention, after step 435 of each l-th current iteration, a decoding attempt is performed based on the VN bit reliabilities determined at the current iteration at the Q-ary variable nodes, and an outcome of the decoding attempt is determined, so that the steps 430 and 435 are reiterated for a subsequent (l+1)-th iteration following the current iteration in case of a negative outcome of the decoding attempt (exit branch Y of step 415) and until a maximum number of decoding iterations $l_{max}$ is reached.

According to the preferred embodiment herein considered, at the first running of the decoding procedure 400 (i.e., l=0), an initialization, for each bit of each symbol, of the respective VN bit reliability takes place (step 405).

Preferably, this is achieved by:

initializing the VN bit reliabilities ($R_{i,t}^{(0)}$) at r of the ($2^r-1$) binary variable nodes $v_t$, preferably according to the bit values ($y_{i,t}$) associated with the respective bits:

$$R_{i,t}^{(0)} = y_{i,t}, \quad 0 \leq t \leq r-1$$

initializing the VN bit reliabilities ($R_{i,t}^{(0)}$) at the remaining ($2^r-1-r$) binary variable nodes $v_t$ according to the parity-check equations associated with the parity-check nodes $p_c$ connected to (i.e., in the neighborhood relationship with) those ($2^r-1-r$) binary variable nodes $v_t$:

$$\|R_{i,t}^{(0)}\| = \min_{t' \in_{\mathcal{S}_q} t' \neq t} \|R_{i,t'}^{(0)}\|;$$

$$r \leq t \leq 2^r - 1$$

At the first running of the decoding procedure 400, the initialized VN bit reliabilities ($R_{i,t}^{(0)}$) at each i-th Q-ary variable node are sent to the respective j-th neighboring Q-ary check node(s):

$$\forall j \in N_i$$
$$r_{i \to j,t}^{(0)} = R_{i,t}^{(0)}$$

According to an embodiment of the present invention, at the first running of the decoding procedure 400 the initialized VN bit reliabilities ($R_{i,t}^{(0)}$) at each i-th Q-ary variable node are directly sent to the respective j-th neighboring Q-ary check nodes (i.e., with the step 430 that immediately follows the step 405).

According to the preferred embodiment of the present invention herein considered, a tentative decoding is still performed based on the initialized VN bit reliabilities ($R_{i,t}^{(0)}$) at each i-th Q-ary variable node. This is preferably achieved by determining, during the first running of the decoding procedure 400, initialized decoding attempts ($E_{i,t}^{(0)}$) of the t-th bit at the t-th binary variable node $v_t$ of the i-th Q-ary variable node based on the initialized VN bit reliabilities ($R_{i,t}^{(0)}$) (preferably, according to the sign of the initialized VN bit reliabilities $R_{i,t}^{(0)}$)); therefore, in this embodiment, at least the steps 410, 415 and 420 are performed after the initialization step (step 405).

The decoding procedure 400 advantageously requires only integer additions, integer comparisons, bit-wise additions (XOR) and some field arithmetic (which may be implemented by using look-up tables), and does not require calculation of probabilities.

Even though bit reliabilities are accumulated through iterations, overflow issues may advantageously be handled with a simple clipping operation. All these attributes make the decoding procedure very attractive for hardware implementations, and particularly for the implementation in the above discussed SSD device.

The applicant has experimentally ascertained that, compared to most of the popular decoding algorithms, the proposed decoding procedure has, in the initialization step, a much lower complexity than all other algorithms (it only needs some integer comparisons and XOR operations to calculate bit reliabilities for the parity-check bits of the binary coset representation).

The applicant has experimentally ascertained that, compared to most of the popular decoding algorithms, the proposed decoding procedure requires, at the variable nodes, a larger number of integer comparisons as well as a larger number of integer additions. This is because bit reliabilities are modified through local parity-check equations after they are updated with check node messages. Although this involves a slight increase in complexity, the use of the local parity-check equations significantly improves performance.

In addition, the proposed decoding procedure, as requiring only integer additions, integer comparisons and XOR operations, may be implemented or designed by very simple hardware.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A method for iteratively decoding read bits in a solid state storage device, wherein the read bits are encoded with a Q-ary LDPC code defined over a binary-extension Galois field $GF(2^r)$ and having length N, the method comprising:
   determining a binary Tanner graph of the Q-ary LDPC code based on a Q-ary Tanner graph of the Q-ary LDPC code, and based on a binary coset representation of the Galois field $GF(2^r)$ according to which the Galois field $GF(2^r)$ includes a plurality of cosets of additive subgroups of size $2^{(r-1)}$ and each element of the Galois field $GF(2^r)$ is represented as a binary value indicative of the belonging or non-belonging of that element to each one of said plurality of cosets, the binary Tanner graph comprising for each Q-ary variable node/Q-ary check node pair of the Q-ary Tanner graph:
   ($2^r-1$) binary variable nodes each one being associated with a respective one of said cosets;
   ($2^r-1-r$) binary parity-check nodes each one being connected to one or more of said ($2^r-1$) binary variable nodes according to said binary coset representation of the Galois field $GF(2^r)$, wherein each binary parity-check node corresponds to a respective parity-check equation associated with a first parity-check matrix that results from said binary coset representation, and
   ($2^r-1$) binary check nodes each one being connected to a respective one of said ($2^r-1$) binary variable nodes according to a second parity-check matrix defining the Q-ary LDPC code,
   mapping the read bits into N symbols each one including, for each bit thereof, a bit value and a reliability thereof,
   providing each symbol of said N symbols to a respective Q-ary variable node, and providing each bit of said each symbol to a respective one of the ($2^r-1$) binary variable nodes of said respective Q-ary variable node, and
   iteratively decoding each symbol based on bit reliabilities of each bit of that symbol determined at each respective binary variable node and at each binary check node connected to that binary variable node, and based on the parity-check equation associated with the first parity-check matrix and corresponding to the parity-check node connected to that binary variable node.

2. The method of claim 1, wherein said iteratively decoding each symbol comprises iteratively performing the following steps:
   i) at each binary check node, determining a first bit reliability of each bit of the respective symbol according to a second bit reliability of that bit that is determined at each binary variable node connected to that binary check node, and,
   ii) at each binary variable node, updating the second bit reliability of each bit of the respective symbol based on the first bit reliability of that bit determined at each binary check node connected to that binary variable node, and based on the parity-check equation associated with the first parity-check matrix and corresponding to the parity-check node connected to that binary variable node.

3. The method of claim 2, wherein said iteratively performing the steps (i) and (ii) is based on Belief Propagation algorithm, or an approximation thereof.

4. The method of claim 2, wherein said iteratively decoding each symbol further comprises, after step ii) of each current iteration, performing a decoding attempt based on the second bit reliability determined at the current iteration, and determining an outcome of the decoding attempt, said iteratively performing the steps i) and ii) for a subsequent iteration following the current iteration being performed in case of a negative outcome of the decoding attempt at the current iteration.

5. The method of claim 4, wherein said determining an outcome of the decoding attempt is based on syndrome calculation on the decoding attempts associated with the binary variable nodes.

6. The method of claim 4, wherein said iteratively performing the steps i) and ii) for a subsequent iteration following the current iteration is performed until a maximum number of decoding iterations is reached.

7. The method of claim 2, further comprising, at a first running of the method, initializing the second bit reliability of each bit at each binary variable node, said initializing comprising:
  initializing the second bit reliability of each bit at r of the $(2^r-1)$ binary variable nodes according to the respective bit value and the reliability thereof, a sign of the reliability of the bit value for example providing said bit value,
  initializing the second bit reliability of each bit at the remaining $(2^r-1-r)$ binary variable nodes according to the parity-check equations associated with the first parity-check matrix and corresponding to the parity-check nodes connected to those binary variable nodes.

8. A controller for a solid state storage device, wherein the controller is configured for:
  reading bits from memory cells of the solid state storage device, wherein the read bits are encoded with a Q-ary LDPC code defined over a binary-extension Galois field $GF(2^r)$ and having length N;
  mapping the read bits into N symbols each one including, for each bit thereof, a bit value and a reliability thereof;
  decoding the N symbols based on a binary Tanner graph of the Q-ary LDPC code, wherein the binary Tanner graph is determined based on a Q-ary Tanner graph of the Q-ary LDPC code, and based on a binary coset representation of the Galois field $GF(2^r)$ according to which the Galois field $GF(2^r)$ includes a plurality of cosets of additive subgroups of size $2^{(r-1)}$ and each element of the Galois field $GF(2^r)$ is represented as a binary value indicative of the belonging or non-belonging of that element to each one of said plurality of cosets, and wherein the binary Tanner graph comprises for each Q-ary variable node/Q-ary check node pair of the Q-ary Tanner graph:
    $(2^r-1)$ binary variable nodes each one being associated with a respective one of said cosets;
    $(2^r-1-r)$ binary parity-check nodes each one being connected to one or more of said $(2^r-1)$ binary variable nodes according to said binary coset representation of the Galois field $GF(2^r)$, wherein each binary parity-check node corresponds to a respective parity-check equation associated with a first parity-check matrix that results from said binary coset representation, and
    $(2^r-1)$ binary check nodes each one being connected to a respective one of said $(2^r-1)$ binary variable nodes according to a second parity-check matrix defining the Q-ary LDPC code,
  wherein the controller is configured for performing said decoding of the N symbols by providing each symbol of said N symbols to a respective Q-ary variable node, wherein each bit of said each symbol is provided to a respective one of the $(2^r-1)$ binary variable nodes of said respective Q-ary variable node, and by iteratively decoding each symbol based on bit reliabilities of each bit of that symbol determined at each respective binary variable node and at each binary check node connected to that binary variable node, and based on the parity-check equation associated with the first parity-check matrix and corresponding to the parity-check node connected to that binary variable node.

9. The controller of claim 8, wherein the controller is configured to perform said iteratively decoding by iteratively performing the following steps:
  i) at each binary check node, determining a first bit reliability of each bit of the respective symbol according to a second bit reliability of that bit that is determined at each binary variable node connected to that binary check node, and,
  ii) at each binary variable node, updating the second bit reliability of each bit of the respective symbol based on the first bit reliability of that bit determined at each binary check node connected to that binary variable node, and based on the parity-check equation associated with the first parity-check matrix and corresponding to the parity-check node connected to that binary variable node.

10. The controller of claim 9, wherein said iteratively performing the steps (i) and (ii) is based on Belief Propagation algorithm, or an approximation thereof.

11. The controller of claim 9, wherein the controller is further configured to, after step ii) of each current iteration, perform a decoding attempt based on the second bit reliability determined at the current iteration, and to determine an outcome of the decoding attempt, the controller being configured to iteratively perform the steps i) and ii) for a subsequent iteration following the current iteration in case of a negative outcome of the decoding attempt at the current iteration.

12. The controller of claim 11, wherein said outcome of the decoding attempt is based on syndrome calculation on the decoding attempts associated with the binary variable nodes.

13. The controller of claim 11, wherein the controller is configured to iteratively perform the steps i) and ii) for a subsequent iteration following the current iteration until a maximum number of decoding iterations is reached.

14. The controller of claim 9, wherein the controller is further configured to initialize the second bit reliability of each bit at each binary variable node, said initializing comprising:
  initializing the second bit reliability of each bit at r of the $(2^r-1)$ binary variable nodes according to the respective bit value and the reliability thereof, a sign of the reliability of the bit value for example providing said bit value,
  initializing the second bit reliability of each bit at the remaining $(2^r-1-r)$ binary variable nodes according to the parity-check equations associated with the first parity-check matrix and corresponding to the parity-check nodes connected to those binary variable nodes.

15. A solid state storage device comprising memory cells and a controller, wherein the controller is configured for:

reading bits from the memory cells of the solid state storage device, wherein the read bits are encoded with a Q-ary LDPC code defined over a binary-extension Galois field $GF(2^r)$ and having length N;

mapping the read bits into N symbols each one including, for each bit thereof, a bit value and a reliability thereof;

decoding the N symbols based on a binary Tanner graph of the Q-ary LDPC code, wherein the binary Tanner graph is determined based on a Q-ary Tanner graph of the Q-ary LDPC code, and based on a binary coset representation of the Galois field $GF(2^r)$ according to which the Galois field $GF(2^r)$ includes a plurality of cosets of additive subgroups of size $2^{(r-1)}$ and each element of the Galois field $GF(2^r)$ is represented as a binary value indicative of the belonging or non-belonging of that element to each one of said plurality of cosets, and wherein the binary Tanner graph comprises for each Q-ary variable node/Q-ary check node pair of the Q-ary Tanner graph:

$(2^r-1)$ binary variable nodes each one being associated with a respective one of said cosets;

$(2^r-1-r)$ binary parity-check nodes each one being connected to one or more of said $(2^r-1)$ binary variable nodes according to said binary coset representation of the Galois field $GF(2^r)$, wherein each binary parity-check node corresponds to a respective parity-check equation associated with a first parity-check matrix that results from said binary coset representation, and $(2^r-1)$ binary check nodes each one being connected to a respective one of said $(2^r-1)$ binary variable nodes according to a second parity-check matrix defining the Q-ary LDPC code, wherein the controller is configured for performing said decoding of the N symbols by providing each symbol of said N symbols to a respective Q-ary variable node, wherein each bit of said each symbol is provided to a respective one of the $(2^r-1)$ binary variable nodes of said respective Q-ary variable node, and by iteratively decoding each symbol based on bit reliabilities of each bit of that symbol determined at each respective binary variable node and at each binary check node connected to that binary variable node, and based on the parity-check equation associated with the first parity-check matrix and corresponding to the parity-check node connected to that binary variable node.

16. The solid state storage device of claim 15, wherein the controller is configured to perform said iteratively decoding by iteratively performing the following steps:

i) at each binary check node, determining a first bit reliability of each bit of the respective symbol according to a second bit reliability of that bit that is determined at each binary variable node connected to that binary check node, and, ii) at each binary variable node, updating the second bit reliability of each bit of the respective symbol based on the first bit reliability of that bit determined at each binary check node connected to that binary variable node, and based on the parity-check equation associated with the first parity-check matrix and corresponding to the parity-check node connected to that binary variable node.

17. The solid state storage device of claim 16, wherein said iteratively performing the steps (i) and (ii) is based on Belief Propagation algorithm, or an approximation thereof.

18. The solid state storage device of claim 16, wherein the controller is further configured to, after step ii) of each current iteration, perform a decoding attempt based on the second bit reliability determined at the current iteration, and to determine an outcome of the decoding attempt, the controller being configured to iteratively perform the steps i) and ii) for a subsequent iteration following the current iteration in case of a negative outcome of the decoding attempt at the current iteration.

19. The solid state storage device of claim 18, wherein said outcome of the decoding attempt is based on syndrome calculation on the decoding attempts associated with the binary variable nodes.

20. The solid state storage device of claim 18, wherein the controller is configured to iteratively perform the steps i) and ii) for a subsequent iteration following the current iteration until a maximum number of decoding iterations is reached.

21. The solid state storage device of claim 16, wherein the controller is further configured to initialize the second bit reliability of each bit at each binary variable node, said initializing comprising:

initializing the second bit reliability of each bit at r of the $(2^r-1)$ binary variable nodes according to the respective bit value and the reliability thereof, a sign of the reliability of the bit value for example providing said bit value, initializing the second bit reliability of each bit at the remaining $(2^r-1-r)$ binary variable nodes according to the parity-check equations associated with the first parity-check matrix and corresponding to the parity-check nodes connected to those binary variable nodes.

* * * * *